(12) United States Patent
Han et al.

(10) Patent No.: US 12,293,437 B2
(45) Date of Patent: May 6, 2025

(54) DE-STREAKING ALGORITHM FOR RADIAL K-SPACE DATA

(71) Applicants: Siemens Healthineers AG, Forchheim (DE); The General Hospital Corporation, Boston, MA (US)

(72) Inventors: Fei Han, Beverly Hills, CA (US); Stephen Farman Cauley, Winchester, MA (US); Vibhas S. Deshpande, Austin, TX (US)

(73) Assignees: Siemens Healthineers AG, Forchheim (DE); The General Hospital Corporation, Boston, MA (US)

( * ) Notice: Subject to any disclaimer, the term of this patent is extended or adjusted under 35 U.S.C. 154(b) by 164 days.

(21) Appl. No.: 18/165,968

(22) Filed: Feb. 8, 2023

(65) Prior Publication Data

US 2024/0265592 A1    Aug. 8, 2024

(51) Int. Cl.
*G06T 11/00*    (2006.01)
*G01R 33/48*    (2006.01)
*G01R 33/565*    (2006.01)
*G06T 7/11*    (2017.01)
*G06T 7/70*    (2017.01)

(52) U.S. Cl.
CPC .......... *G06T 11/005* (2013.01); *G01R 33/482* (2013.01); *G01R 33/56545* (2013.01); *G06T 7/11* (2017.01); *G06T 7/70* (2017.01); *G06T 2207/10088* (2013.01); *G06T 2207/30004* (2013.01); *G06T 2211/448* (2023.08)

(58) Field of Classification Search
CPC . G06T 11/005; G06T 7/11; G06T 7/70; G06T 2207/10088; G06T 2207/300004; G06T 2211/448; G01R 33/482; G01R 33/56545
See application file for complete search history.

(56) References Cited

U.S. PATENT DOCUMENTS

| | | | |
|---|---|---|---|
| 10,768,260 B2 * | 9/2020 | Moeller | G06T 7/0012 |
| 11,860,256 B2 * | 1/2024 | Fu | G06T 11/008 |
| 2019/0383894 A1 * | 12/2019 | Liu | A61B 5/055 |

* cited by examiner

*Primary Examiner* — Gregory H Curran

(57) ABSTRACT

Systems and methods include segmentation of a first image of a subject to identify locations of anatomical structures of the subject, determination of a region of interest of the subject based on the locations of anatomical structures, determination of a coil-mixing matrix based on the region of interest, control of an MR scanner to acquire radial trajectory k-space data of the subject from each of a plurality of RF coils of the MR scanner, application of the coil-mixing matrix to the radial trajectory k-space data of the subject acquired from each of the plurality of RF coils to generate first radial trajectory k-space data, reconstruction of a second image of the subject based on the first radial trajectory k-space data, and display of the second image.

17 Claims, 5 Drawing Sheets

DE-STREAKING ALGORITHM FOR RADIAL K-SPACE DATA

BACKGROUND

Magnetic Resonance (MR) imaging is useful in scenarios which require identification of different soft tissues within a patient. MR imaging does not subject tissues to ionizing radiation and can therefore be conducted regularly to monitor disease progression and/or response to treatment. An MR scanner acquires k-space data of patient anatomy by delivering radio-frequency pulses and encoding gradients thereto according to a specified pulse sequence. Traditionally, the k-space data is acquired in a Cartesian trajectory, which can then be reconstructed into a three-dimensional image using a Fourier Transform.

Acquisition of the k-space data in a radial trajectory (e.g., as individual spokes with a hub at the center of k-space) has been found to be advantageous in some scenarios. The center of k-space is associated with low frequency signals representing the general shape of an object while regions farther from the center are associated with high frequency signals representing object edges and details. Accordingly, due to radially-acquired k-space data's higher density of near the center of k-space, radial acquisition provides information regarding the general structure of an object using fewer lines than a corresponding Cartesian acquisition. Moreover, radial acquisition is motion-robust because the data near the center of k-space is sampled more frequently.

Images reconstructed from radially-sampled k-space data often include streaking artifacts, which reduce their diagnostic value and negatively impact quantification accuracy and precision. Streaking artifacts commonly result from under-sampling (i.e., insufficient radial samples in k-space), but can also occur due to other reasons, such as magnetic field imperfections, subject motion and high signal intensity. Due to the nature of k-space image reconstruction, these artifacts may propagate through the entire image even though they originate from specific spatial locations.

The acquisition of additional radial spokes of k-space data may reduce streaking artifacts in images reconstructed therefrom. While this approach may reduce artifacts, it also prolongs data acquisition. Other approaches include applying a low-pass filter on a reconstructed image, at the cost of losing fine details of the image. Systems are desired for efficiently reducing streaking artifacts in images reconstructed from radial-sampled k-space data for a given number of acquired radial spokes and with less image loss than in conventional approaches.

DETAILED DESCRIPTION

The following description is provided to enable any person in the art to make and use the described embodiments. Various modifications, however, will remain readily apparent to those in the art.

Some embodiments provide a method to reduce streaking artifacts from radial acquisitions by suppressing signals from multi-channel k-space data which originate from certain locations of a patient. The locations from which signals are suppressed may be, for example, locations in which field inhomogeneity is high (e.g., at the edge of the field-of-view), where movement is detected (e.g., the head), or all locations other than a specific region (e.g., the heart). The locations may be determined based on user input or automatically in view of a segmented image (e.g., a scout image) of the patient.

The signals from the locations are suppressed by applying a coil-mixing matrix to multi-channel k-space data acquired during an MR scan. The coil-mixing matrix is determined such that application of the coil-mixing matrix to the multi-channel k-space data suppresses signals from the locations. Calculation of the coil-mixing matrix may be tailored to specific applications for maximizing streak artifact reduction while preserving signal-to-noise ratio (SNR) and desirable information in the image.

Figure 1:
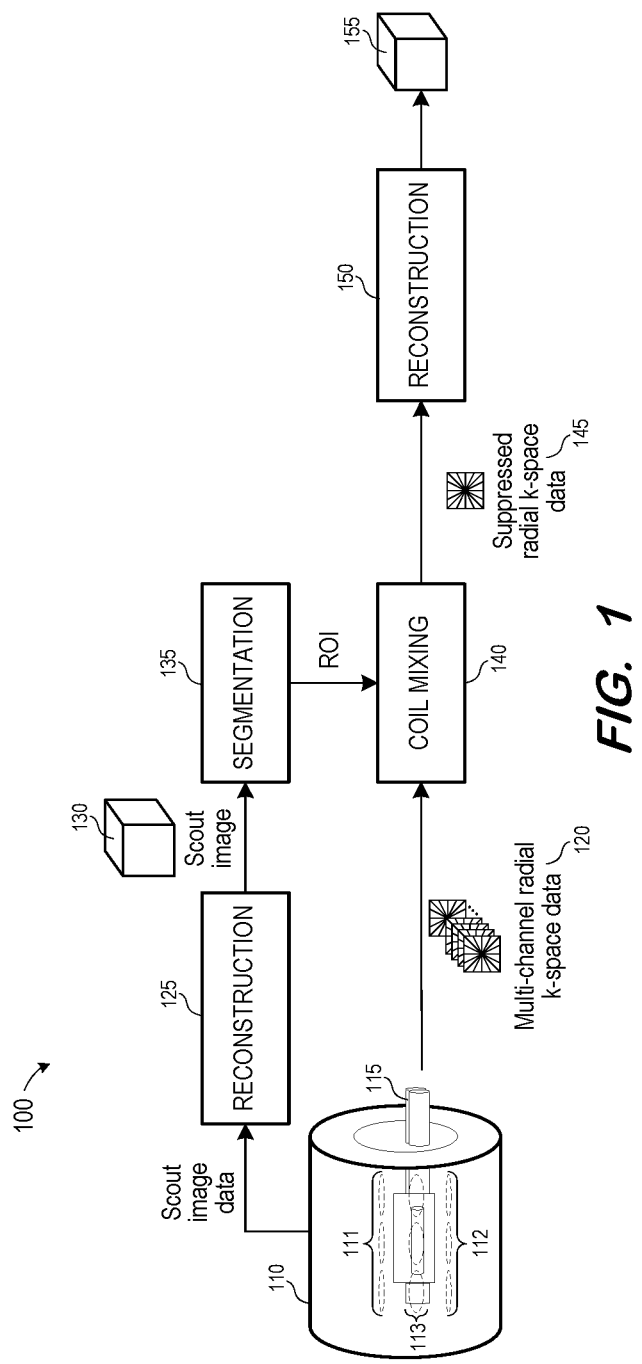
FIG. 1 illustrates an architecture for de-streaking multi-channel radial k-space data according to some embodiments.

FIG. 1 illustrates architecture 100 depicting an architecture for de-streaking multi-channel radial k-space data according to some embodiments. MR scanner 110 may comprise any suitable MR scanner that is or becomes known. As is known in the art, MR scanner 110 executes a pulse sequence to acquire MR signals (i.e., k-space data) from subject 115.

More particularly, MR scanner 110 includes RF coils 111, 112 and 113. Embodiments may include any number of coils disposed in any arrangement with respect to patient 115. Each of RF coils 111, 112 and 113 transmits RF signals to patient 115 according to a specified pulse sequence and receives RF signals therefrom. The RF signals received by a coil are converted to k-space data, such that a separate set of k-space data is determined for each coil. Each set is considered a "channel", and therefore all the separate k-space data acquired by the coils is referred to as multi-channel k-space data.

Embodiments may utilize spin-echo pulse sequences or gradient-echo pulse sequences, for example, to acquire the multi-channel k-space data. Generally, a pulse sequence is a preselected set of defined RF and gradient pulses, where execution of the set results in acquisition of one line of k-space data. The time interval between pulses and the amplitude and shape of the gradient pulses are selected and varied over repeated executions so as to acquire various lines of k-space data which each pass through the center of k-space (i.e., radial k-space data). Multi-channel radial k-space data 120 illustrates sets of radial k-space data acquired by respective ones of RF coils 111, 112 and 113.

According to some embodiments, acquisition of multi-channel radial k-space data 120 is preceded by acquisition of a scout image. A scout image is typically used to assist a technician in identifying the relative position of an area of patient 115 to be imaged via MR imaging. As is known in the art, the scout image may be generated based on k-space data acquired by MR scanner 110 (e.g., using a single shot image acquisition pulse sequence) or by another imaging modality, such as a computed tomography scanner integrated into MR scanner 110. Reconstruction component 125 applies a suitable image reconstruction algorithm to the scout image data (e.g., k-space data or CT data) to generate scout image 130.

Segmentation component 135 applies currently-or hereafter-known methods to identify different locations within scout image 130. As is known in the art, segmentation component 135 may determine different organs, skeletal structures, tissue, etc. of patient 115 represented within scout image 130 and determine rough three-dimensional boundaries thereof. Segmentation component 135 also outputs information identifying an ROI of patient 115. Locations of patient 115 other than the ROI are locations from which any signals received should be suppressed.

According to some embodiments, a user may review the boundaries identified by segmentation component and select the ROI therefrom. For example, the user may determine that a left arm of patient 115 moved during acquisition of data 120 and may therefore select all locations but the location of the left arm as the ROI. In another example, the most prominent streak artifacts in abdominal imaging applications typically originate from the arms due to the field inhomogeneity at those locations, and therefore both arms may be excluded from the ROI. In some embodiments, movement at one location (e.g., the head) is detected by automatic means (e.g., a motion-sensing camera) and the other locations are automatically selected as the ROI based on the boundaries determined by segmentation component 130.

In some embodiments, segmentation component 135 identifies the boundaries of the heart of patient 115 and the user selects the area circumscribed by the boundaries as the ROI. In such a case, signals received from all locations other than the location of the heart should be suppressed. Segmentation component 135 may be preconfigured to identify the heart and automatically output the location thereof as the ROI.

Coil mixing component 140 operates to determine a coil-mixing matrix based on the received ROI and to apply the coil-mixing matrix to multi-channel radial k-space data 120 to suppress signals received from locations other than the ROI. A coil-mixing matrix is typically used to combine k-space data acquired by each coil into a single set of k-space data in a complex manner (e.g., complex number weighting/complex number matrix multiplication). Such combination may be for optimization purposes or to identify bad coil.

In contrast, and according to the present embodiments, the goal of applying a coil-mixing matrix is to generate a set of k-space data in which k-space data received from locations other than the ROI is suppressed. Coil mixing component 140 may determine a coil-mixing matrix by determining a matrix which transforms an image of patient 115 into a mask of the ROI. Since both the patient image and the ROI mask are known, the matrix may be solved for via direct inversion or optimization processes. These processes may be executed in view of constraints such as SNR preservation.

Suppressed radial k-space data 145 results from application of the determined coil-mixing matrix to multi-channel radial k-space data 120. Reconstruction component 150 uses known reconstruction algorithms to generate three-dimensional image 155 based on suppressed radial k-space data 145. The algorithms used by reconstruction component 150 may differ from the algorithms used by reconstruction component 125, particularly if the data input to reconstruction component 125 is not radial k-space data, but embodiments are not limited thereto. Advantageously, three-dimensional image 155 may exhibit fewer streaking artifacts than an image conventionally reconstructed from multi-channel radial k-space data 120.

Figure 2:
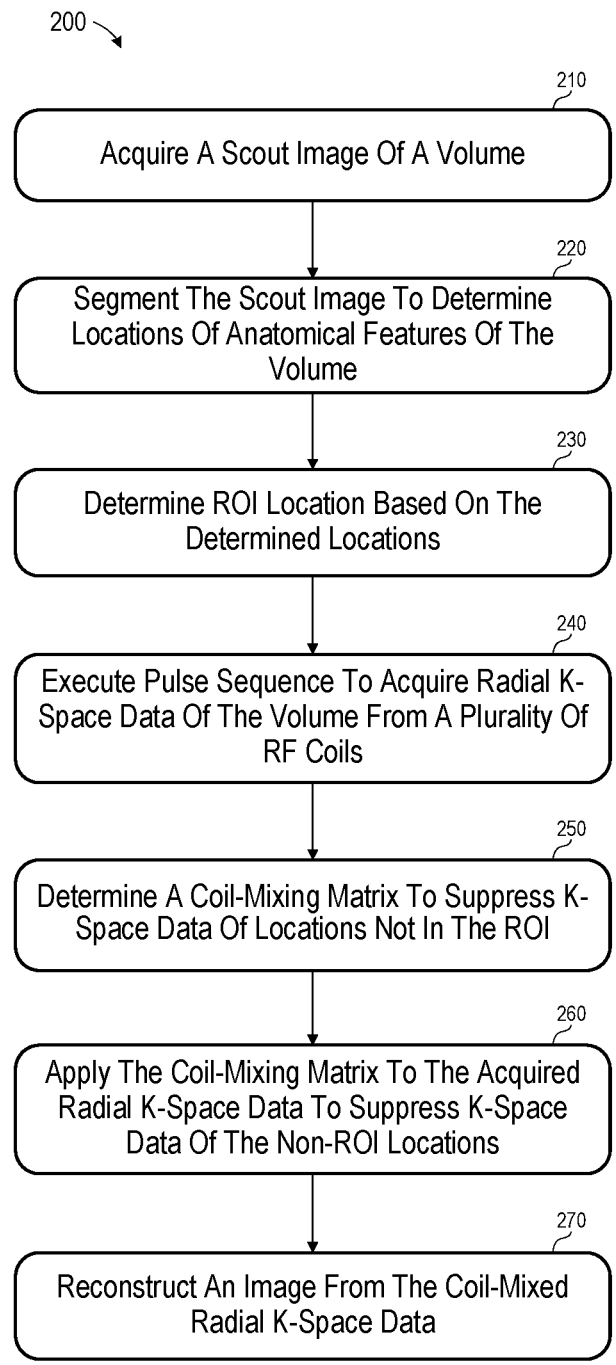
FIG. 2 comprises a flow diagram of a process to de-streak multi-channel radial k-space data according to some embodiments.

FIG. 2 comprises a flow diagram of process 200 to de-streak multi-channel radial k-space data according to some embodiments. Process 200 may be executed by various components of architecture 100, but embodiments are not limited thereto. In some embodiments, various hardware elements (e.g., one or more processing units) execute program code to perform process 200. The steps of process 200 need not be performed by a single device or system, nor temporally adjacent to one another.

Process 200 and all other processes mentioned herein may be embodied in program code read from one or more of non-transitory computer-readable media, such as a disk-based or solid-state hard drive, a DVD-ROM, a Flash drive, and a magnetic tape, and executed by one or more processing units (e.g., processors, processor cores, processor threads). In some embodiments, hard-wired circuitry may be used in place of, or in combination with, program code for implementation of processes according to some embodiments. Embodiments are therefore not limited to any specific combination of hardware and software.

Initially, at 210, a scout image of a volume is acquired. The scout image may be generated based on k-space data acquired by an MR scanner in which the volume (e.g., a patient) is disposed. The pulse sequence used to acquire the k-space data of the scout image may be selected to generate a suitable scout image while requiring minimal acquisition time, such as a single-shot pulse sequence. The scout image may be acquired by another imaging modality, such as but not limited to computed tomography, positron emission tomography and single-photon emission computed tomography. If a non-MR modality is used, the scout image may be acquired so as to be registerable with the MR scanner to be used in subsequent steps of process 200.

The scout image is segmented at 220 as is known in the art to determine locations of anatomical features of the volume. The anatomical features may include, but are not limited to, organs, skeletal structures, and other tissue. The locations may be determined as three-dimensional boundaries circumscribing the structures, and may be represented using any suitable data format.

Next, at 230, the location of an ROI is determined based on the locations determined at 220. As described above, signals received from locations other than the ROI locations are to be suppressed. 230 may include user selection of the ROI from a display of the segmented scout image showing the determined locations. In another example, the user selects a location of the displayed segmented image from which signals should be suppressed, and the ROI location is determined at 230 to include all locations other than the selected location. In yet another example, the ROI is determined at 230 based on a preset setting without post-acquisition user input. The setting may specify, for example, that the locations of the arms and the heart are to be suppressed and therefore all other locations are determined as the ROI at 230.

According to some embodiments, a mask is generated based on the determined ROI location at 230. For example, the ROI of the scout image may be processed using image processing operators, including smoothing, shrinking or dilatation, to produce a binary mask or a grayscale mask representing the location of the ROI.

Figure 3:
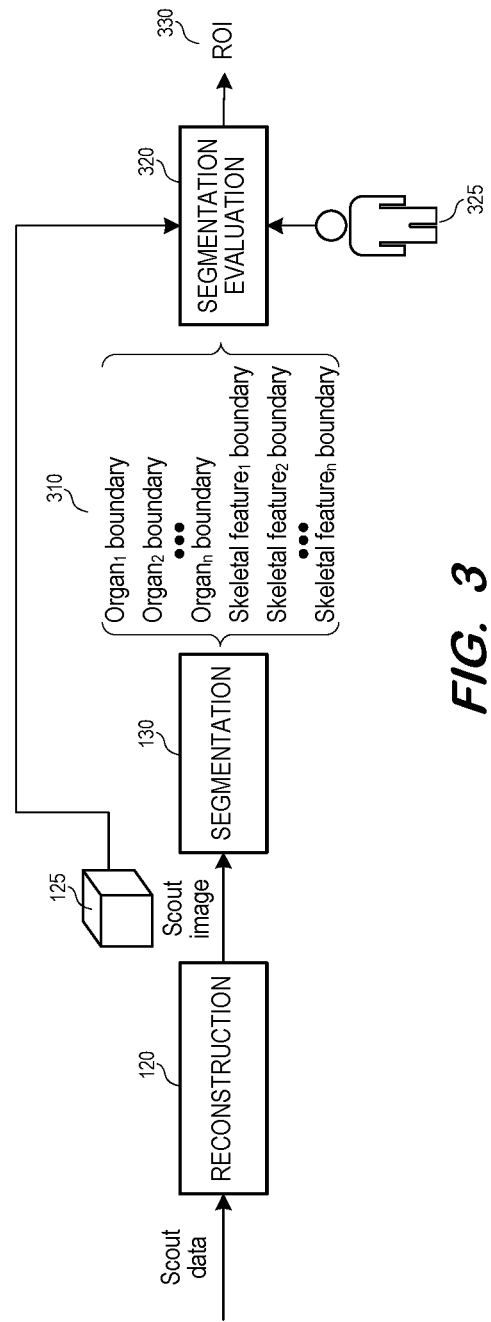
FIG. 3 illustrates determination of one or more target locations in a de-streaking algorithm according to some embodiments.

FIG. 3 illustrates 210-230 according to some embodiments. As shown and described with respect to FIG. 1, reconstruction component 120 receives scout data and reconstructs scout image 125 therefrom. Segmentation component 130 segments scout image 125 to identify anatomical features within scout image 125 and determine boundaries 310 of the identified anatomical features. Scout image 125 and boundaries 310 are received by segmentation evaluation component 320. Segmentation evaluation component 320 may display scout image 125 with graphics indicating boundaries 310 overlaid thereon, and user 325 may select ROI 330 from the displayed image. Embodiments are not limited thereto.

A pulse sequence is executed at 240 to acquire radial k-space data of the volume from each of a plurality of RF coils. The radial k-space data acquired from a given RF coil represents one channel, and therefore the k-space data acquired at 240 may be considered multi-channel data. The pulse sequence may be executed by an MR scanner as is known in the art and may comprise a spin-echo pulse sequence or a gradient-echo pulse sequence, for example.

A coil-mixing matrix is determined at 250. The coil-mixing matrix is determined so as to suppress k-space data received from locations of the volume which are not in the ROI. According to some embodiments of 250, a first image is reconstructed from multi-channel k-space data. The first image may be constructed by performing a first-pass image reconstruction on the k-space data acquired at 240 or by interpolation of low-resolution data acquired pre-scan, for example. The first image is noted as I and the number of channels is noted as Nc. The ROI mask is applied to the image I, resulting in a masked image $I_m$. Coil-mixing matrix C is a Nc-by-Nc complex matrix that transforms the first image I to the masked image $I_m$. Coil-mixing matrix C can be numerically calculated by solving the inverse problem $I*C=I_m$ using direct inversion or optimization.

Figure 4:
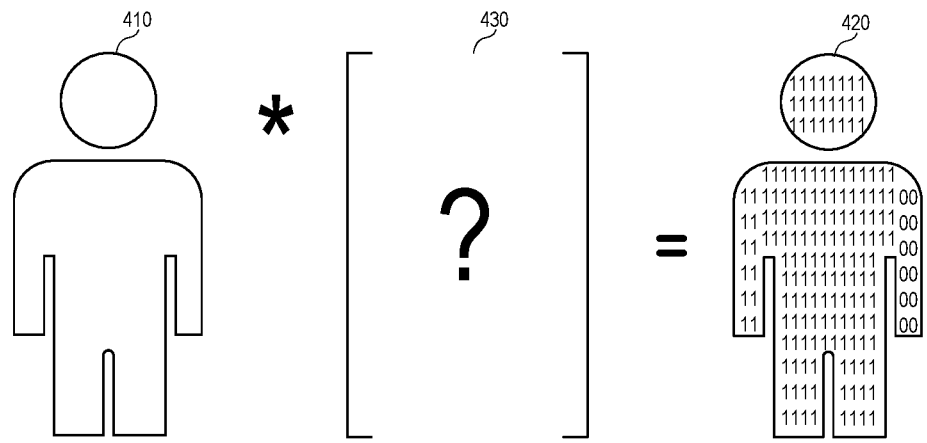
FIG. 4 illustrates determination of a coil matrix based on one or more target locations according to some embodiments.
Figure 5:
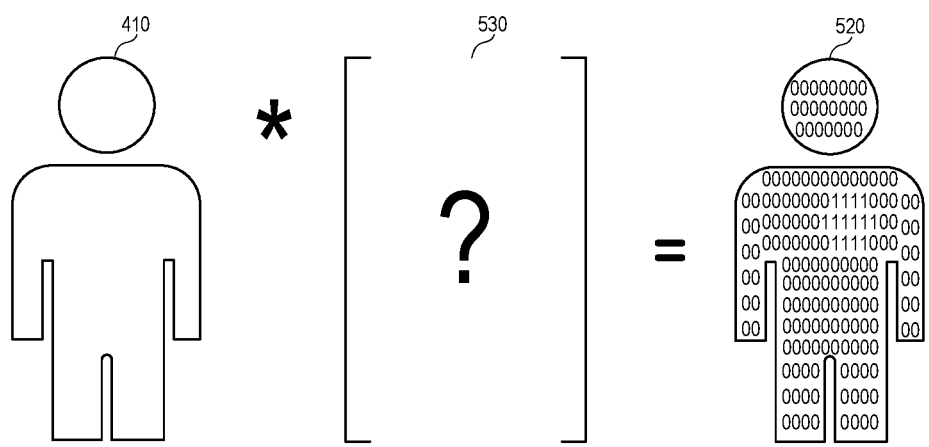
FIG. 5 illustrates determination of a coil matrix based on one or more target locations according to some embodiments.

FIGS. 4 and 5 illustrate 250 according to some embodiments. Image 410 of FIG. 4 is the first image I mentioned above, and may be reconstructed from the k-space data acquired at 240 or from pre-scan data. Image 420 is image 410 after application of a binary ROI mask thereto (i.e., masked image $I_m$). As shown, the binary mask applied to image 410 includes 0's at locations of the left arm and 1's at all other locations. The other locations therefore represent the ROI and coil-mixing matrix 430 (i.e., coil-mixing matrix C in the equation above) is determined so as to suppress signals from the left arm.

FIG. 5 also shows image 410 as described above. Image 520 of FIG. 5 represents masked image $I_m$ after application of a binary ROI mask which is different from the binary mask applied in FIG. 4. In particular, the binary mask applied to image 410 in FIG. 5 includes 1's at locations of the heart and 0's at all other locations. Accordingly, the heart is the ROI and coil-mixing matrix 530 is to be determined at 250 such that signals from all other locations are suppressed thereby.

In some embodiments, the coil-mixing matrix may be calculated for individual two-dimensional slices irrespective of whether the original acquisition is two-dimensional or three-dimensional. In acquisitions where each two-dimensional slices slice is acquired more than once, the coil-mixing matrix need only be calculated once.

The determined coil-mixing matrix is applied to the acquired radial k-space data at 260 to suppress k-space data of the non-ROI. 260 may comprise matrix multiplication of the radial k-space data and the determined coil-mixing matrix C. Since C is a square matrix, the dimension of the k-space data is not changed after application of the coil-mixing matrix.

An image is reconstructed from the coil-mixed radial k-space data at 270. For example, known reconstruction algorithms are applied to the coil-mixed radial k-space data to generate a three-dimensional image, but embodiments are not limited thereto. The three-dimensional image may exhibit fewer streaking artifacts than an image reconstructed from the multi-channel radial k-space data acquired at 240.

Figure 6:
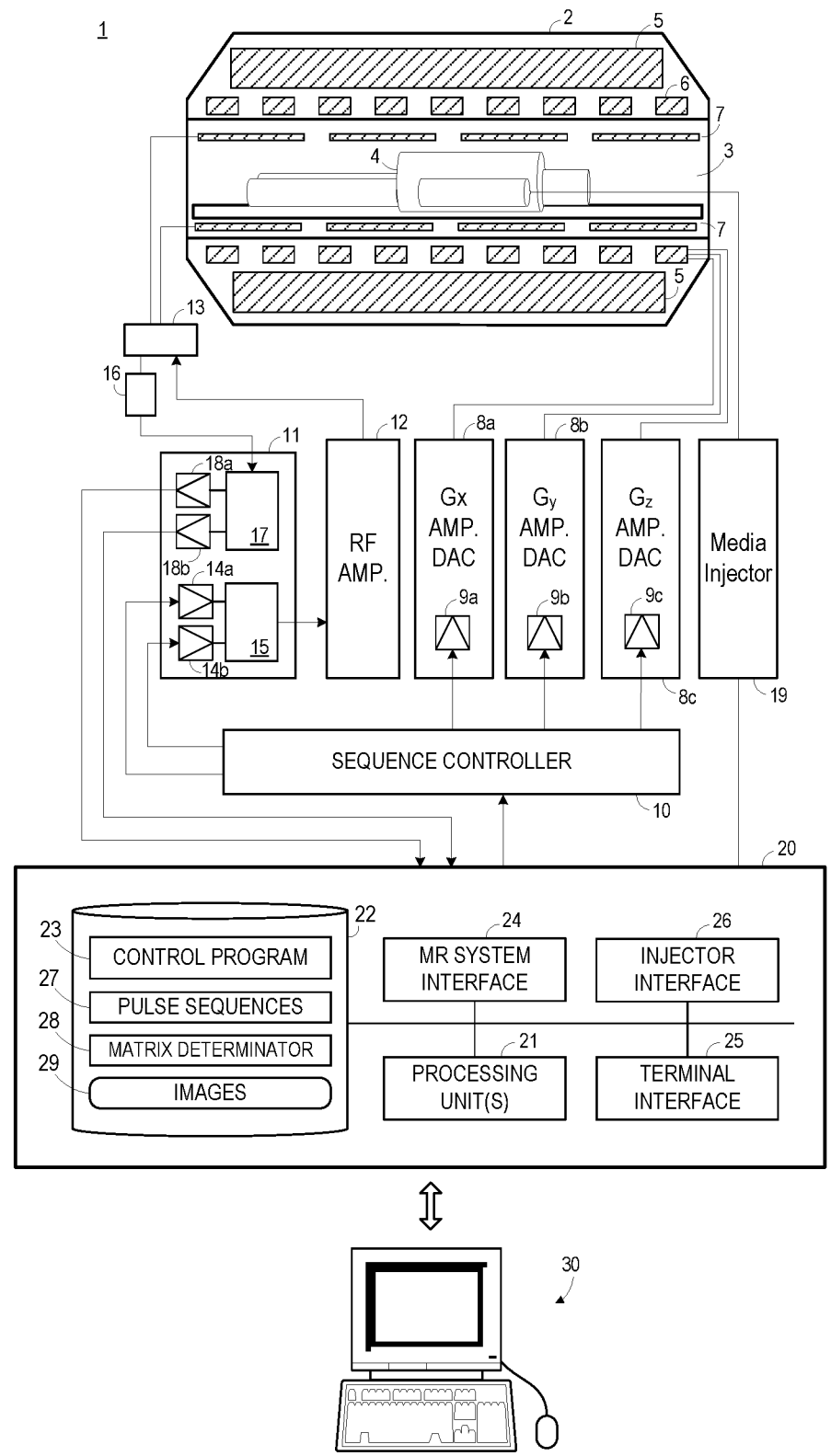
FIG. 6 is a block diagram of an MR imaging system according to some embodiments.

FIG. 6 illustrates MR system 1 for executing pulse sequences to acquire k-space data and reconstructing images therefrom according to some embodiments. Embodiments are not limited to MR system 1.

MR system 1 includes MR chassis 2, which defines bore 3 in which patient 4 is disposed. MR chassis 2 includes polarizing main magnet 5, gradient coils 6 and RF coils 7 arranged about bore 3. According to some embodiments, polarizing main magnet 5 generates a uniform main magnetic field ($B_0$) and RF coils 7 emit an excitation field ($B_1$).

According to MR techniques, a volume of material (e.g., human tissue) is subjected to a main polarizing magnetic field (i.e., $B_0$), causing the individual magnetic moments of the nuclear spins in the substance to process about the polarizing field in random order at their characteristic Larmor frequency, in an attempt to align with the field. A net magnetic moment $M_z$ is produced in the direction of the polarizing field, and the randomly oriented magnetic components in the perpendicular plane (the x-y plane) cancel out one another.

The material is then subjected to an excitation field (i.e., $B_1$) created by emission of a radiofrequency (RF) pulse, which is in the x-y plane and near the Larmor frequency, causing the net aligned magnetic moment $M_z$ to rotate into the x-y plane so as to produce a net transverse magnetic moment $M_t$, which is rotating, or spinning, in the x-y plane at the Larmor frequency. The excitation field is terminated, and signals are emitted by the excited spins as they return to their pre-excitation field state. The emitted signals are detected, digitized and processed to reconstruct an image using one of many well-known MR reconstruction techniques.

Gradient coils 6 produce magnetic field gradients $G_x$, $G_y$, and $G_z$ which are used for position-encoding MR signals. The magnetic field gradients $G_x$, $G_y$, and $G_z$ distort the main magnetic field in a predictable way so that the Larmor frequency of nuclei within the main magnetic field varies as a function of position. Accordingly, an excitation field $B_1$ which is near a particular Larmor frequency will tip the net aligned moment $M_z$ of those nuclei located at field positions which correspond to the particular Larmor frequency, and signals will be emitted only by those nuclei after the excitation field $B_1$ is terminated.

Gradient coils 6 may consist of three windings, for example, each of which is supplied with current by an amplifier 8a-8c in order to generate a linear gradient field in its respective Cartesian direction (i.e., x, y, or z). Each amplifier 8a-8c includes a digital-analog converter 9a-9c which is controlled by a sequence controller 10 to generate desired gradient pulses at proper times.

Sequence controller 10 also controls the generation of RF pulses by RF system 11 and RF power amplifier 12. RF system 11 and RF power amplifier 12 are responsive to a scan prescription and direction from sequence controller 10 to produce RF pulses of the desired frequency, phase, and pulse amplitude waveform. The generated RF pulses may be applied to each of RF coils 7. RF coils 7 convert the RF pulses emitted by RF power amplifier 12, via multiplexer 13, into a magnetic alternating field in order to excite the nuclei and align the nuclear spins of the object to be examined or the region of the object to be examined. RF pulses may be emitted in a magnetization preparation step in order to enhance or suppress certain signals.

The RF pulses are represented digitally as complex numbers. Sequence controller 10 supplies these numbers in real and imaginary parts to digital-analog converters 14a-14b in RF system 11 to create corresponding analog pulse sequences. Transmission channel 15 modulates the pulse sequences with a radio-frequency carrier signal having a base frequency corresponding to the resonance frequency of the nuclear spins in the volume to be imaged.

RF coils 7 both emit radio-frequency pulses as described above and scan the alternating field which is produced as a result of precessing nuclear spins, i.e. the nuclear spin echo signals. The received signals are received by multiplexer 13, amplified by RF amplifier 16 and demodulated in receiving channel 17 of RF system 11 in a phase-sensitive manner. Analog-digital converters 18a and 18b convert the demodulated signals into real and imaginary components.

Computing system 20 receives the real and imaginary components from analog-digital converters 18a and 18b and may process the components according to known techniques. Such processing may for example, combining the multi-channel k-space data, suppressing signals using a coil-mixing matrix as described herein, reconstructing two-dimensional or three-dimensional images by performing a Fourier transformation of k-space data, performing other image reconstruction techniques such as iterative or back-projection reconstruction techniques, applying filters to raw k-space data or to reconstructed images, generating functional magnetic resonance images, calculating motion or flow images, and generating a chemical shift vs. magnitude spectrum.

System 20 may comprise any general-purpose or dedicated computing system. Accordingly, system 20 includes one or more processing units 21 (e.g., processors, processor cores, execution threads, etc.) configured to execute processor-executable program code to cause system 20 to operate as described herein, and storage device 22 for storing the program code. Storage device 22 may comprise one or more fixed disks, solid-state random-access memory, and/or removable media (e.g., a thumb drive) mounted in a corresponding interface (e.g., a USB port).

Storage device 22 stores program code of control program 23. One or more processing units 21 may execute control program 23 to provide instructions to sequence controller 10 via MR system interface 24. For example, sequence controller 10 may be instructed to initiate a desired pulse sequence of pulse sequences 27. In particular, sequence controller 10 may be instructed to control the switching of magnetic field gradients via amplifiers 8a-8c at appropriate times, the transmission of radio-frequency pulses having a specified phase and amplitude at specified times via RF system 11 and RF amplifier 12, and the readout of the resulting MR signals.

Control program 23 may also be executed to control injector interface 26 as required by various pulse sequences of pulse sequences 27. In response, injector interface 26 controls media injector 19 to inject contrast media into subject 4 as is known in the art. For example, media injector 19 may be controlled to inject a designated amount of media into patient 4 at a designated rate and at a designated time prior to execution of a pulse sequence.

Storage device 22 stores program code of matrix determinator 28 which is executable to determine a coil-mixing matrix as described herein. Images 29 may be generated conventionally and/or as described herein. Images 29 may be provided to terminal 30 via terminal interface 25 of system 20. Terminal interface 25 may also receive input from terminal 30, which may be used to provide commands to control program 23 in order to control sequence controller 10 and/or other elements of system 1. The commands may include commands to initiate an imaging sequence to acquire image data of a subject and commands to specify an ROI based on an image displayed by terminal 30. Terminal 30 may 30 may simply comprise a display device and an input device coupled to system 20. In some embodiments, terminal 30 is a separate computing device such as, but not limited to, a desktop computer, a laptop computer, a tablet computer, and a smartphone.

Each element of system 1 may include other elements which are necessary for the operation thereof, as well as additional elements for providing functions other than those described herein. Storage device 22 may also store data and other program code for providing additional functionality and/or which are necessary for operation of system 20, such as device drivers, operating system files, etc.

Executable program code according to the above description may be stored on a form of non-transitory computer-readable media. Computer-readable media includes volatile and nonvolatile, removable, and non-removable media implemented in any method or technology for storage of information such as program code, data structures, program modules or other data. Computer-readable media includes, but is not limited to, random access memory (RAM), read-only memory (ROM), electrically erasable programmable ROM (EEPROM), flash memory or other memory technology, compact disk ROM (CD-ROM), digital volatile disks (DVD) or other optical storage, magnetic cassettes, magnetic tape, magnetic disk storage or other magnetic storage devices, or any other medium which can be used to store the desired instructions and which may be accessed by a system (e.g., a computer), including by internet or other computer network form of access.

The foregoing diagrams represent logical architectures for describing processes according to some embodiments, and actual implementations may include more or different components arranged in other manners. Other topologies may be used in conjunction with other embodiments. Moreover, each component or device described herein may be implemented by any number of devices in communication via any number of other public and/or private networks. Two or more of such computing devices may be located remote from one another and may communicate with one another via any known manner of network(s) and/or a dedicated connection. Each component or device may comprise any number of hardware and/or software elements suitable to provide the functions described herein as well as any other functions. For example, any computing device used in an implementation of a system according to some embodiments may include a processor to execute program code such that the computing device operates as described herein.

Embodiments described herein are solely for the purpose of illustration. Those in the art will recognize other embodiments may be practiced with modifications and alterations to that described above.

What is claimed is:
1. A system comprising:
a magnet system configured to generate a polarizing magnetic field about at least a portion of a subject;
a gradient system to apply a gradient magnetic field to the polarizing magnetic field;

a plurality of radio frequency (RF) coils to apply an excitation field to the subject and to each acquire a single channel of k-space data from the subject;
a display; and
a computing system to execute program code to:
  determine a region of interest of the subject;
  determine a coil-mixing matrix to combine single channels of k-space data and suppress k-space data of the single channels of k-space data which is not acquired from the region of interest;
  control the gradient system and the plurality of radio frequency (RF) coils to acquire single-channel radial trajectory k-space data of the subject from each of the plurality of RF coils;
  apply the coil-mixing matrix to the single-channels of radial trajectory k-space data of the subject acquired from the plurality of RF coils to generate first single-channel radial trajectory k-space data;
  reconstruct an image based on the first single-channel radial trajectory k-space data; and
  display the image on the display.

2. A system according to claim 1, wherein determination of the coil-mixing matrix comprises:
  determination of a mask based on the region of interest;
  application of the mask to a first image of the subject to generate a masked image; and
  determination of a coil-mixing matrix to transform the first image of the subject to the masked image.

3. A system according to claim 2, wherein the first image is reconstructed from the radial trajectory k-space data of the subject acquired from each of the plurality of RF coils.

4. A system according to claim 1, wherein determination of the coil-mixing matrix comprises:
  determination of a mask based on the region of interest;
  application of the mask to a first image of the subject to generate a masked image; and
  determination of a coil-mixing matrix to transform the first image of the subject to the masked image.

5. A system according to claim 4, wherein the region of interest is a selected anatomical structure.

6. A system according to claim 4, wherein the region of interest consists of locations of the subject which do not include a selected anatomical structure.

7. A method comprising:
  segmenting a first image of a subject to identify locations of anatomical structures of the subject;
  determining a region of interest of the subject based on the locations of anatomical structures;
  determining a coil-mixing matrix to combine single channels of k-space data and suppress k-space data of the single channels of k-space data which is not acquired from the region of interest;
  controlling an MR scanner to acquire a single channel of radial trajectory k-space data of the subject from each of a plurality of RF coils of the MR scanner;
  applying the coil-mixing matrix to the single channels of radial trajectory k-space data of the subject acquired from the plurality of RF coils to generate first single-channel radial trajectory k-space data;
  reconstructing a second image of the subject based on the first single-channel radial trajectory k-space data; and
  displaying the second image.

8. A method according to claim 7, wherein determining the coil-mixing matrix comprises:
  determining a mask based on the region of interest;
  applying the mask to a third image of the subject to generate a masked image; and
  determining a coil-mixing matrix to transform the third image of the subject to the masked image.

9. A method according to claim 8, wherein the third image is reconstructed from the radial trajectory k-space data of the volume acquired from each of the plurality of RF coils.

10. A method according to claim 7, wherein determining the coil-mixing matrix comprises:
  determining a mask based on the region of interest;
  applying the mask to a third image of the subject to generate a masked image; and
  determining a coil-mixing matrix to transform the third image of the subject to the masked image.

11. A method according to claim 10, wherein the region of interest is a selected one of the anatomical structures.

12. A method according to claim 10, wherein the region of interest consists of locations of the subject which do not include a selected one of the anatomical structures.

13. A computing system comprising:
  a memory storing program code; and
  one or more processing units to execute the program code to:
  segmenting a first image of a subject to identify locations of anatomical structures of the subject;
  determining a region of interest of the subject based on the locations of anatomical structures;
  determining a coil-mixing matrix to combine single channels of k-space data and suppress k-space data of the single channels of k-space data which is not acquired from the region of interest;
  controlling an MR scanner to acquire a single channel of radial trajectory k-space data of the subject from each of a plurality of RF coils of the MR scanner;
  applying the coil-mixing matrix to the single channels of radial trajectory k-space data of the subject acquired from the plurality of RF coils to generate first single-channel radial trajectory k-space data;
  reconstructing a second image of the subject based on the first single-channel radial trajectory k-space data; and
  displaying the second image.

14. A system according to claim 13, wherein determination of the coil-mixing matrix comprises:
  determination of a mask based on the region of interest;
  application of the mask to a third image of the subject to generate a masked image; and
  determination of a coil-mixing matrix to transform the third image of the subject to the masked image.

15. A system according to claim 14, wherein the third image is reconstructed from the radial trajectory k-space data of the volume acquired from each of the plurality of RF coils.

16. A system according to claim 13, wherein determination of the coil-mixing matrix comprises:
  determination of a mask based on the region of interest;
  application of the mask to a third image of the subject to generate a masked image; and
  determination of a coil-mixing matrix to transform the third image of the subject to the masked image.

17. A system according to claim 16, wherein the region of interest consists of locations of the subject which do not include a selected one of the anatomical structures.

* * * * *